United States Patent
Aga et al.

(10) Patent No.: US 6,846,718 B1
(45) Date of Patent: Jan. 25, 2005

(54) METHOD FOR PRODUCING SOI WAFER AND SOI WAFER

(75) Inventors: Hiroji Aga, Gunma (JP); Naoto Tate, Gunma (JP); Susumu Kuwabara, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 193 days.

(21) Appl. No.: 09/857,803

(22) PCT Filed: Oct. 13, 2000

(86) PCT No.: PCT/JP00/07111
§ 371 (c)(1),
(2), (4) Date: Jun. 11, 2001

(87) PCT Pub. No.: WO01/28000
PCT Pub. Date: Apr. 19, 2001

(30) Foreign Application Priority Data

Oct. 14, 1999 (JP) .......................................... 11-292134

(51) Int. Cl.[7] .............................................. H01L 21/76
(52) U.S. Cl. ...................... 438/406; 438/458; 438/506; 438/514; 438/528; 438/977
(58) Field of Search ................................. 438/458, 406, 438/506, 514, 528, 977, FOR 365, FOR 386, FOR 403, FOR 408, FOR 158, FOR 485; 148/DIG. 12

(56) References Cited

U.S. PATENT DOCUMENTS

| | | | | |
|---|---|---|---|---|
| 5,494,849 A | * | 2/1996 | Iyer et al. | 148/DIG. 12 |
| 5,668,045 A | * | 9/1997 | Golland et al. | 148/DIG. 12 |
| 5,834,812 A | * | 11/1998 | Golland et al. | 257/347 |
| 5,863,832 A | * | 1/1999 | Doyle et al. | 148/DIG. 12 |
| 5,937,312 A | * | 8/1999 | Iyer et al. | 148/DIG. 12 |
| 5,989,981 A | * | 11/1999 | Nakashima et al. | 438/459 |
| 6,074,479 A | * | 6/2000 | Adachi et al. | 117/204 |

(List continued on next page.)

FOREIGN PATENT DOCUMENTS

| | | | | |
|---|---|---|---|---|
| DE | 19753494 A1 | * | 10/1998 | H01L/21/20 |
| JP | A 7-321120 | | 12/1995 | |
| JP | A 8-264552 | | 10/1996 | |
| JP | A 10-242154 | | 9/1998 | |
| JP | A 10-275905 | | 10/1998 | |
| JP | 10275905 A | * | 10/1998 | H01L/27/12 |
| JP | A 10-335616 | | 12/1998 | |
| JP | A 11-145436 | | 5/1999 | |
| JP | A 11-186277 | | 7/1999 | |
| JP | A 11-191617 | | 7/1999 | |
| JP | 11316154 A | * | 11/1999 | G01J/1/02 |
| JP | 2000012864 A | * | 1/2000 | H01L/29/786 |

OTHER PUBLICATIONS

Wolf, Stanley, "Silicon Processing for the VLSI Era", vol. 1, 1986 by Lattice Press, pp. 23-25.*

Primary Examiner—George Fourson
Assistant Examiner—Michelle Estrada
(74) Attorney, Agent, or Firm—Oliff & Berridge, PLC

(57) ABSTRACT

A method for producing an SOI wafer by the hydrogen ion delamination method comprising at least a step of bonding a base wafer and a bond wafer having a micro bubble layer formed by gas ion implantation and a step of delaminating a wafer having an SOI layer at the micro bubble layer as a border, wherein, after the delamination step, the wafer having an SOI layer is subjected to a two-stage heat treatment in an atmosphere containing hydrogen or argon utilizing a rapid heating/rapid cooling apparatus (RTA) and a batch processing type furnace. Preferably, the heat treatment by the RTA apparatus is performed first. Surface roughness of an SOI layer surface delaminated by the hydrogen ion delamination method is improved over the range from short period to long period, and SOI wafers free from generation of pits due to COPs in SOI layers are efficiently produced with high throughput.

3 Claims, 4 Drawing Sheets

U.S. PATENT DOCUMENTS

| | | | |
|---|---|---|---|
| 6,103,599 A * | 8/2000 | Henley et al. | 438/458 |
| 6,140,210 A * | 10/2000 | Aga et al. | 438/407 |
| 6,191,007 B1 | 2/2001 | Matsui et al. | |
| 6,224,668 B1 * | 5/2001 | Tamatsuka | 117/84 |
| 6,238,990 B1 * | 5/2001 | Aga et al. | 438/143 |
| 6,245,645 B1 * | 6/2001 | Mitani et al. | 438/455 |
| 6,251,754 B1 * | 6/2001 | Ohshima et al. | 438/406 |
| 6,261,362 B1 * | 7/2001 | Fujikawa et al. | 117/19 |
| 6,284,628 B1 * | 9/2001 | Kuwahara et al. | 438/457 |
| 6,284,629 B1 * | 9/2001 | Yokokawa et al. | 156/344 |
| 6,312,797 B1 * | 11/2001 | Yokokawa et al. | 428/336 |
| 6,313,014 B1 * | 11/2001 | Sakaguchi et al. | 257/347 |
| 6,350,703 B1 * | 2/2002 | Sakaguchi et al. | 438/766 |
| 6,387,829 B1 | 5/2002 | Usenko et al. | |
| 6,403,502 B1 * | 6/2002 | Kobayashi et al. | 438/795 |
| 6,613,678 B1 | 9/2003 | Sakaguchi et al. | |
| 2002/0127820 A1 * | 9/2002 | Sato | 438/458 |
| 2004/0063298 A1 | 4/2004 | Aga et al. | |

\* cited by examiner

METHOD FOR PRODUCING SOI WAFER AND SOI WAFER

TECHNICAL FIELD

The present invention relates to a method for producing an SOI (Silicon On Insulator) wafer, more specifically, a method for producing an SOI wafer by the so-called hydrogen ion delamination method (also called Smart Cut Method (registered trademark)) comprising bonding an ion-implanted wafer to another wafer that serves as a substrate and then delaminating the wafers to produce an SOI wafer, in which surface roughness is improved by a heat treatment after the delamination, and an SOI wafer produced by the method. Further, the present invention also relates to a method for producing an SOI wafer that can reduce bonding failures during the production of the SOI wafer and can provide SOI wafers with good yield, in which a heat treatment is performed after the delamination.

BACKGROUND ART

Recently, as a method for producing an SOI wafer, the method comprising bonding a wafer implanted with hydrogen ions or the like and then delaminating the wafer to produce an SOI wafer (a technique called hydrogen ion delamination method: Smart Cut Method (registered trademark)) is newly coming to attract much attention. This method is a technique for producing an SOI wafer, wherein an oxide layer is formed on at least one of two silicon wafers, at least either hydrogen ions or rare gas ions are implanted into one wafer from its top surface to form a micro bubble layer (enclosed layer) in this silicon wafer, then the ion-implanted surface of the wafer is bonded to the other silicon wafer via the oxide layer, thereafter the wafers were subjected to a heat treatment (delamination heat treatment) to delaminate one of the wafer as a thin film at the micro bubble layer as a cleavage plane, and the other wafer is further subjected to a heat treatment (bonding heat treatment) to obtain an SOI wafer in which an SOI layer is firmly bonded on the silicon wafer (refer to Japanese Patent Laid-open (Kokai) Publication No. 5-211128).

When an SOI wafer is produced by the hydrogen ion delamination method, the SOI layer surface as it is after the delamination at the micro bubble layer as a cleavage plane has higher surface roughness compared with a mirror-polished wafer used for usual device production, and therefore the wafer as it is cannot be used for the device production. Accordingly, in order to improve the aforementioned surface roughness, polishing using a small amount of stock removal for polishing, which is called touch polish, is usually performed.

However, the SOI layer is extremely thin, and therefore when its surface is polished, there is caused a problem that variation in SOI layer thickness becomes large due to fluctuation of the polishing amount within the surface.

Therefore, it was proposed to improve the surface roughness by a heat treatment of the SOI layer surface immediately after the delamination, without using polishing.

Japanese Patent Laid-open (Kokai) Publication No. 10-242154 discloses a method wherein, after a second heat treatment for strengthening bonding of a support substrate and a single crystal silicon thin film (bonding heat treatment), a third heat treatment is performed at a temperature of 1000— 1300° C. for 10 minutes to 5 hours in a hydrogen atmosphere to improve average surface roughness of the silicon thin film.

Further, Japanese Patent Laid-open (Kokai) Publication No. 10-275905 discloses a method for producing an SOI wafer wherein a wafer of the SOI structure having a delaminated surface, which is obtained by the hydrogen ion delamination method, is subjected to annealing in a hydrogen atmosphere (hydrogen annealing) to flatten the delaminated surface.

Thus, any of the techniques disclosed in the aforementioned patent documents utilizes a heat treatment in a hydrogen atmosphere to improve the surface roughness of a delaminated wafer.

The aforementioned Japanese Patent Laid-open (Kokai) Publication No. 10-242154 defines temperature and time for the third heat treatment (hydrogen annealing) for improving the average surface roughness. However, if, for example, the SOI layer (single crystal silicon thin film) is formed from a wafer produced by the Czochralski method (CZ method) and it has a small thickness of about 0.5 μm or less, there is caused a problem that a buried oxide layer is etched by hydrogen gas penetrated through COP (Crystal Originated Particle), which is a void-like grown-in defect, when the hydrogen annealing is performed. Further, although it is known that a heat treatment performed in an argon atmosphere also improves the surface roughness like the heat treatment in hydrogen, however, it also cannot obviate the problem of etching through COP. That is, it is known that a CZ wafer has crystal defects called COPs introduced therein during the crystal growth, and it has become clear that, if such a CZ wafer is utilized for the bond wafer to be a device active layer, COPs exist also in the SOI layer and in a case of an extremely thin SOI layer, which is required in recent years, the COPs penetrate the SOI layer and form pinholes to markedly degrade electric characteristics.

Meanwhile, Japanese Patent Laid-open (Kokai) Publication No. 10-275905 discloses that, as specific methods for the heat treatment (annealing), the heat treatment can be performed by any one of short time annealing (rapid thermal anneal, RTA) of the single wafer processing in which wafer is treated one by one and plasma annealing, besides the method of hydrogen annealing performed for several tens of seconds to several tens of minutes in a hydrogen atmosphere using a batch processing type furnace.

Among the aforementioned various heat treatments (annealing), the rapid thermal annealing (RTA) utilizing a rapid heating/rapid cooling apparatus can be performed within an extremely short period of time. Therefore, it was considered that the aforementioned buried oxide layer was not etched, COPs in the SOI layer could be eliminated simultaneously, and thus the surface roughness could be improved efficiently.

However, when the inventors of the present invention precisely investigated the improvement of the surface roughness of SOI wafer by RTA, it was found that it was only short period components of surface roughness that were improved to a level comparable to that of mirror-polished wafers for the usual device production, and long period components were still extremely inferior to those of the mirror-polished wafers.

When the relationship between the heat treatment time and the surface roughness was further investigated, it was found that, in order to improve the long period components of surface roughness by an RTA apparatus, a heat treatment of high temperature for long period of time (for example, at 1225° C. for 3 hours or more) was required.

However, since the heat treatment performed by an RTA apparatus is one of the single wafer processing type, treatment for a long period of time lowers throughput and degrades efficiency. In addition, it increases the production cost. Therefore, it is not practical.

On the other hand, although a batch processing furnace that enables a heat treatment for a long period of time can treat a lot of wafers at one time, it suffers from a problem that the buried oxide layer is etched through COPs in the SOI layer during the hydrogen annealing treatment to form pits due to the slower temperature increasing rate.

DISCLOSURE OF THE INVENTION

The present invention was accomplished in order to solve the aforementioned problems, and its object is to improve surface roughness over the range from short period to long period of an SOI layer surface delaminated by the hydrogen ion delamination method without polishing and to secure its thickness uniformity, as well as to efficiently produce SOI wafers free from generation of pits due to COPs in SOI layers with high throughput.

In order to achieve the aforementioned object, the present invention provides a method for producing an SOI wafer by the hydrogen ion delamination method comprising at least a step of bonding a base wafer and a bond wafer having a micro bubble layer formed by gas ion implantation and a step of delaminating a wafer having an SOI layer at the micro bubble layer as a border, wherein, after the delamination step, the wafer having an SOI layer is subjected to a two-stage heat treatment in an atmosphere containing hydrogen or argon utilizing a rapid heating/rapid cooling apparatus and a batch processing type furnace.

If a wafer having an SOI layer is subjected to a heat treatment consisting of two stages utilizing separately a rapid heating/rapid cooling apparatus and a batch processing type furnace after the delamination as described above, surface crystallinity is restored and the surface roughness of short periods is improved in the heat treatment by the rapid heating/rapid cooling apparatus, and the surface roughness of long periods can be improved by the heat treatment utilizing the batch processing type furnace. Further, since a plurality of wafers can be subjected to a heat treatment at one time in the batch processing type furnace, the wafers can be produced with higher throughput compared with a case where wafers are subjected to a heat treatment for a long period of time by the single wafer processing in a rapid heating/rapid cooling apparatus.

Furthermore, since this method does not use polishing such as touch polishing, thickness uniformity of the SOI layer is also secured.

Further, in the aforementioned method, the two-stage heat treatment is preferably performed by subjecting the wafers to a heat treatment in the rapid heating/rapid cooling apparatus and then a heat treatment in the batch processing type furnace.

In the present invention, both of the short period components and long period components of surface roughness are improved by the two-stage heat treatment as described above. If the heat treatment in the rapid heating/rapid cooling apparatus for a short period of time is performed as the first stage, crystallinity of the surface is restored and COPs in the SOI layer are markedly reduced. Therefore, when the heat treatment by the batch processing type furnace is performed in a subsequent stage, COPs in the SOI layer are substantially eliminated already. Accordingly, even if the heat treatment is performed for a relatively long period of time, the etching of the buried oxide layer by hydrogen gas or argon gas, which is caused through penetrated COPs, is suppressed, and thus pits are not generated.

Further, the present invention also provides a method for producing an SOI wafer by the hydrogen ion delamination method comprising at least a step of bonding a base wafer and a bond wafer having a micro bubble layer formed by gas ion implantation and a step of delaminating a wafer having an SOI layer at the micro bubble layer as a border, wherein an FZ wafer, an epitaxial wafer or a CZ wafer of which COPs at least on surface are reduced is used as the bond wafer, and the wafer having an SOI layer is subjected to a heat treatment under an atmosphere containing hydrogen or argon in a batch processing type furnace after the delamination step.

If an SOI wafer is produced by using any one of an FZ wafer, an epitaxial wafer and a CZ wafer of which COPs at least on surface are reduced is used as the bond wafer as described above, COPs in the SOI layer can be reduced or substantially completely eliminated. Therefore, the problem of etching of the buried oxide layer due to COPs is not caused, and a heat treatment at a high temperature for a long period of time in a batch processing type furnace also becomes possible.

Further, another object of the present invention is to provide SOI wafers with good yield by reducing bonding failures such as voids and blisters generated at a bonding surface, when SOI wafers of which COPs in the SOI layer are reduced are produced as described above.

To this end, the present invention also provides a method characterized by using a CZ wafer produced from a single crystal ingot of which COPs are reduced for the whole crystal as a wafer used for the bond wafer.

If a CZ wafer produced from a single crystal ingot of which COPs are reduced for the whole crystal is used as described above, a usual mirror-polished surface can be used as a bonding surface, and therefore bonding failures can be reduced compared with a case utilizing an epitaxial wafer. Further, since the method utilizes a CZ wafer, it can be applied to a wafer having a large diameter such as 200 mm, 300 mm or a further larger diameter, which are considered difficult to be produced for FZ wafers. Furthermore, since COPs are reduced for the whole crystal (whole wafer), the stock removal of the delaminated plane for polishing is not required to be limited, when the delaminated wafer is recycled as a bond wafer.

Further, by subjecting an SOI wafer produced as described above, in which COPs in the SOI layer are reduced, to a heat treatment under an atmosphere containing hydrogen or argon in a batch processing type furnace, the surface roughness of the SOI layer can be reduced without producing pits of the buried oxide layer.

According to the present invention, there is further provided an SOI wafer which is produced by the aforementioned method, characterized in that the wafer has an RMS (root mean square roughness) value of 0.5 nm or less concerning surface roughness for both of 1 $\mu$m square and 10 $\mu$m square.

Thus, in the SOI wafer produced according to the present invention, although it is produced without polishing, both of the short period components (for example, about 1 $\mu$m square) and the long period components (for example, about 10 $\mu$m square) of the surface roughness of the SOI layer are improved, and both of RMS values therefor are very small, i.e., 0.5 nm or less, which means surface roughness comparable to that of mirror-polished wafers. In addition, the film thickness does not become uneven unlike in a case where the surface is polished. Therefore, such an SOI wafer can suitably be used for the production of recent highly integrated devices.

As explained above, in the method for producing an SOI wafer of the present invention, by subjecting a wafer having an SOI layer to a two-stage heat treatment utilizing a rapid heating/rapid cooling apparatus and a batch processing type furnace in an atmosphere containing hydrogen or argon after the delamination step, both of short period components and long period components of surface roughness of delaminated plane of the wafer can be markedly improved. Further, crystallinity is also restored, and pits due to COPs in the bond wafer to be used are not generated.

Furthermore, the short period components of surface roughness are improved within an extremely short period of time by the heat treatment using an RTA apparatus, and in addition, a lot of wafers can be processed at one time and the long period components are improved in a batch processing type furnace. Therefore, the heat treatment can be efficiently performed as a whole, and thus SOI wafers of superior surface characteristics can be produced at a low cost.

BEST MODE FOR CARRYING OUT THE INVENTION

Hereafter, embodiments of the present invention will be explained with reference to the appended drawings. However, the present invention is not limited to these.

Figure 1:
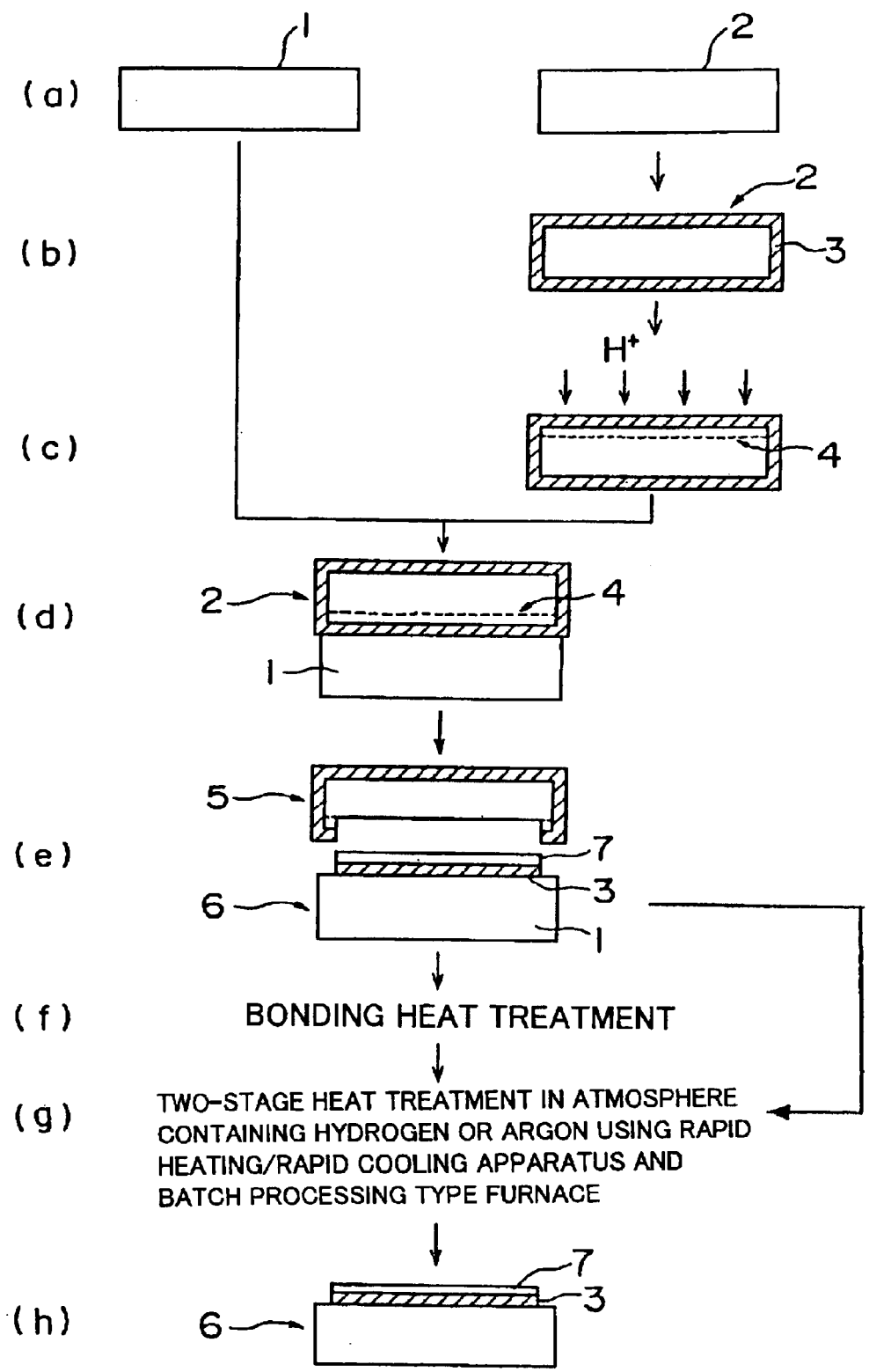
FIG. 1(a) to (h) show a flow diagram of an exemplary process for producing an SOI wafer by the hydrogen ion delamination method according to the present invention.

FIG. 1 shows a flow diagram of an exemplary process for producing an SOI wafer by the hydrogen ion delamination method according to the present invention.

The present invention will be explained hereafter mainly as for a case where two of silicon wafers are bonded.

In the hydrogen ion delamination method shown in FIG. 1, two mirror-surface silicon wafers are prepared first in the step (a). That is, a base wafer 1 that serves as a substrate and a bond wafer 2 from which an SOI layer is obtained, which correspond to specifications of devices, are prepared.

Then, in the step (b), at least one of the wafers, the bond wafer 2 in this case, is subjected to thermal oxidation to form an oxide layer 3 having a thickness of about 0.1–2.0 $\mu$m on its surface.

In the step (c), at least either hydrogen ions or rare gas ions, hydrogen ions in this case, are implanted into one surface of the bond wafer 2 on which surface the oxide layer was formed to form a micro bubble layer (enclosed layer) 4 parallel to the surface in mean penetrating depth of the ions. The ion implantation temperature is preferably 25–450° C.

The step (d) is a step of superimposing the base wafer 1 on the hydrogen ion-implanted surface of the hydrogen ion implanted bond wafer 2 via an oxide layer and bonding them. By contacting the surfaces of two of the wafers to each other in a clean atmosphere at an ordinary temperature, the wafers are adhered to each other without using an adhesive or the like.

The subsequent step (e) is a delamination heat treatment step in which the wafers were delaminated at the enclosed layer 4 as a border to separate them into a delaminated wafer 5 and a wafer 6 having an SOI layer (SOI layer 7+buried oxide layer 3+base wafer 1). For example, if the wafers are subjected to a heat treatment at a temperature of about 500° C. or more under an inert gas atmosphere, the wafers are separated into the delaminated wafer 5 and the wafer 6 having an SOI layer due to rearrangement of crystals and aggregation of bubbles (this wafer may be simply called SOI wafer hereinafter including such a wafer subjected to a heat treatment).

As for the steps thus far, the method of the present invention is the same as the conventional hydrogen ion delamination method. And in the present invention, the method is characterized by subjecting the wafer 6 having an SOI layer 7 to a two-stage heat treatment in an atmosphere containing hydrogen or argon using a rapid heating/rapid cooling apparatus and a batch processing type furnace (step (g)), after the delamination heat treatment step (e). In this case, the atmosphere containing hydrogen or argon may consist of 100% of hydrogen, 100% of argon or a mixed gas of hydrogen and argon.

In addition, after the delamination heat treatment step (e) and before performing the two-stage heat treatment step (g), the bonding heat treatment may be performed in the step (f) like a conventional method. Since the bonding strength of the wafers brought into close contact in the aforementioned bonding step (d) and the delamination heat treatment step (e) as it is would be weak for use in the device production process, the wafer 6 having an SOI layer is subjected to a heat treatment at a high temperature as a bonding heat treatment in this step (f) to obtain sufficient bonding strength. This heat treatment is preferably performed, for example, at 1050° C. to 1200° C. for 30 minutes to 2 hours under an inert gas atmosphere.

In the present invention, after the delamination heat treatment step (e), the wafer 6 having an SOI layer is subjected to the bonding heat treatment as required, and then subjected to the two-stage heat treatment in an atmosphere containing hydrogen or argon using a rapid heating/rapid cooling apparatus and a batch processing type furnace. In this case, since it is inefficient to separately perform the bonding heat treatment (step (f)) and the two-stage heat treatment, the two-stage heat treatment using a rapid heating/rapid cooling apparatus and a batch processing type furnace according to the present invention may also serve as the bonding heat treatment.

As for the order of the heat treatment using a rapid heating/rapid cooling apparatus and the heat treatment using a batch processing type furnace, the heat treatment using a rapid heating/rapid cooling apparatus is preferably performed first, in particular, when a usual CZ wafer having a lot of COPs is used as a bond wafer.

This is because of the following reasons. A CZ wafer contains COPs introduced during the crystal production as described above. Therefore, when the SOI layer is thin as required in recent years, the COPs may exist while penetrating the SOI layer to form pinholes. In such a case, if the wafer is subjected to a heat treatment in an atmosphere containing hydrogen or argon over a long period of time in a batch processing type furnace, hydrogen gas or argon gas may penetrate through the pinholes and etch the buried oxide layer 3 to form pits during the heat treatment.

Therefore, when a usual CZ wafer is used as the bond wafer, if the heat treatment by the rapid heating/rapid cooling apparatus is performed first to improve the short period components of surface roughness and simultaneously restore the surface crystallinity to markedly reduce COPs in the SOI layer, and then the heat treatment is performed in the batch processing type furnace for a relatively long period of time to improve the long period components, both of the short period components and long period components of surface roughness will be improved, and possibility of the generation of pits will also be eliminated.

On the other hand, if an epitaxial wafer, FZ wafer or CZ wafer of which COPs at least on surface are reduced is used as the bond wafer, the aforementioned problem of the etching of the buried oxide layer is not caused. Therefore, either of the heat treatments may be performed first in principle, and it also becomes possible to perform the heat treatment at a high temperature for a long period of time by using only a batch processing type furnace, while omitting the heat treatment using a rapid heating/rapid cooling apparatus.

That is, if the material of the bond wafer is suitably selected, an SOI wafer excellent in both of the short period components and long period components of surface roughness can be obtained by subjecting the wafer to a heat treatment at a temperature of about 1000–1300° C. for 10 minutes to about 5 hours in a batch processing type furnace, while avoiding the problem of etching of the buried oxide layer, as in the case of performing the two-stage heat treatment.

Examples of the CZ wafer of which COPs at least on surface are reduced include a CZ wafer produced from a single crystal ingot of which COPs are reduced for the whole crystal by changing a usual CZ single crystal pulling rate (about 1 mm/min) to a pulling rate of, for example, 0.6 mm/min or lower, a CZ wafer produced from a single crystal ingot of which grown-in defects such as COPs are reduced for the whole crystal by controlling V/G (V: pulling rate, G: temperature gradient along the direction of solid-liquid interface of crystal), or a CZ wafer produced with usual pulling conditions and subjected to a heat treatment in an atmosphere of hydrogen, argon or the like to reduce COPs contained in at least a region of wafer surface to be an SOI layer, and so forth.

Through the aforementioned steps (a) to (g), there can be obtained an SOI wafer 6 of high quality, in which both of the long period components and short period components of surface roughness are improved, and which has an SOI layer 7 of high crystal quality and high thickness uniformity and shows no pit formation (step (h)).

Further, by selecting a CZ wafer produced from a single crystal ingot of which COPs are reduced for the whole crystal as the CZ wafer of which COPs at least on surface are reduced, the following remarkable advantages can be obtained.

That is, it is considered that, as a bond wafer for producing an SOI wafer of which COPs in the SOI layer are reduced compared with an SOI wafer produced by using a CZ wafer produced under the usual crystal pulling conditions, besides use of a CZ wafer produced from a single crystal ingot of which COPs are reduced for the whole crystal, an epitaxial wafer, FZ wafer or CZ wafer subjected to hydrogen (argon) annealing may be used.

However, in the case of epitaxial wafer, an epitaxial layer is deposited on a surface of usual mirror-polished wafer, and its surface roughness (haze level) is degraded compared with a usual mirror-polished surface. Furthermore, projections called mounds and the like may be generated on the surface. Therefore, if such a surface is bonded, bonding failures called voids or blisters are likely to occur due to the influence of the degraded surface roughness: or protrusions. Therefore, there may be used a measure of slightly polishing the epitaxial layer and then using it for bonding.

On the other hand, in the case of a CZ wafer produced from a single crystal ingot of which COPs are reduced for the whole crystal, since a mirror-polished surface of a mirror-surface wafer sliced from the single crystal and processed can be used as it is, the bonding failures can be reduced compared with an epitaxial wafer.

Further, when the bond wafer after the delamination is recycled as a bond wafer, the delaminated plane must be polished before use. However, an epitaxial wafer suffers from a problem that, if the stock removal for polishing becomes large, the epitaxial layer may be removed. Therefore, it is necessary to take a countermeasure such as depositing the epitaxial layer with a sufficiently large thickness beforehand or making the stock removal for polishing small. This problem is similarly applied to a wafer of which COPs are reduced only in the vicinity of the wafer surface, like a CZ wafer subjected to hydrogen (argon) annealing.

In contrast, in the case of a CZ wafer produced from a single crystal ingot of which COPs are reduced for the whole crystal, since COPs are reduced for the whole wafer, the stock removal for polishing is not limited for recycling at all, and the wafer can be recycled for a plurality of times.

Further, a CZ wafer produced from a single crystal ingot of which COPs are reduced for the whole crystal is advantageous in view of the possibility of the production of wafers having a larger diameter. As for FZ wafers, the maximum diameter of wafers currently produced on commercial level is 150 mm, and it is extremely difficult to obtain wafers having a diameter of 200 mm, 300 mm or a further larger diameter. As for CZ wafers, on the other hand, those having a diameter of 300 mm are already mass-produced, and study for production of those having a further larger diameter is also progressing. Therefore, it is well possible to meet the demand for a larger diameter.

As described above, the production of SOI wafers by the hydrogen ion delamination method using CZ wafers produced from a single crystal ingot of which COPs are reduced for the whole crystal as bond wafers is the only method that simultaneously has three kinds of advantages, i.e., reduction of bonding failures, reuse of bond wafers and usability for wafers of a large diameter.

The two-stage heat treatment performed in the present invention will be explained in more detail hereafter.

First, the heat treatment performed in an atmosphere containing hydrogen or argon using a rapid heating/rapid cooling apparatus can be performed in a temperature range of 1000° C. to the melting point or lower of silicon for 1–300 seconds.

By subjecting a wafer having an SOI layer after the delamination to a heat treatment in an atmosphere containing hydrogen or argon using a rapid heating/rapid cooling apparatus, crystallinity of the SOI layer surface can be efficiently restored in an extremely short period of time, surface roughness, in particular, short period components thereof (about 1 μm square) can be improved, and COPs in the SOI layer can also be markedly reduced. The heat treatment can be performed more effectively in a temperature range of 1200–1350° C.

Examples of such an apparatus that can rapidly heat and rapidly cool an SOI wafer in an atmosphere containing hydrogen or argon, which is used in the present invention, include apparatuses such as lamp heaters based on heat radiation. As an example of commercially available apparatuses, SHS-2800 produced by AST Corp. can be mentioned. These apparatuses are not particularly complicated, and are not expensive either.

Figure 6:
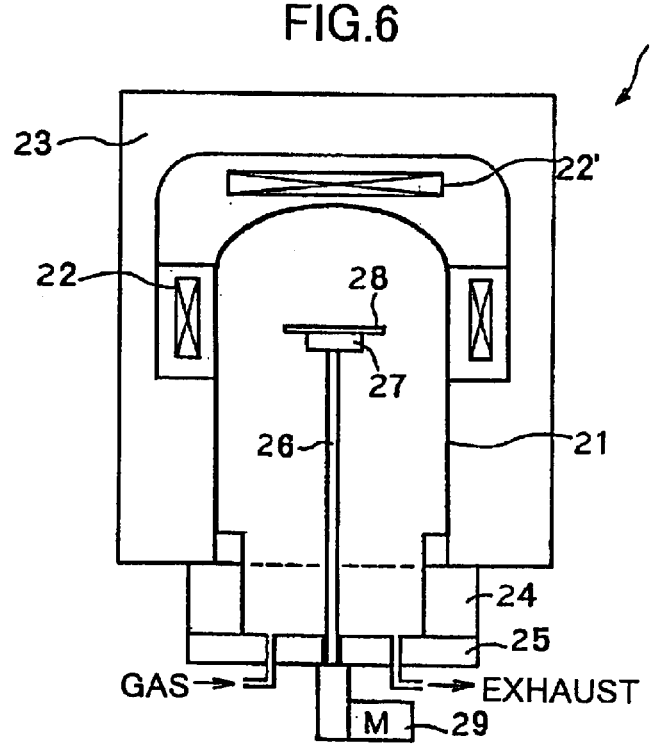
FIG. 6 is a schematic view showing an exemplary rapid heating/rapid cooling apparatus.

An example of apparatus that can rapidly heat and rapidly cool a wafer having an SOI layer in an atmosphere containing hydrogen or argon, which is used in the present invention, will be explained hereinafter. FIG. 6 is a schematic view of an apparatus capable of rapid heating and rapid cooling.

The heat treatment apparatus 20 shown in FIG. 6 has a bell jar 21 composed of, for example, silicon carbide or quartz, and a wafer is heat-treated in this bell jar 21. Heating is performed by heaters 22 and 22', which are disposed so that they should surround the bell jar 21. These heaters are each constituted by an upper heater and a lower heater which are separated from each other, so that electric power supplied to each of them can be independently controlled. Of course, the heating mechanism is not limited to this, and the so-called radiant heating, radiofrequency heating and so forth may also be used. A housing 23 for shielding heat is disposed outside the heaters 22 and 22'.

A water cooled chamber 24 and a base plate 25 are disposed under a furnace, and they shut the inside of the bell jar 21 off from the outer air. An SOI wafer 28 is held on a stage 27, and the stage 27 is fixed at the top of supporting shaft 26, which can be freely moved upward and downward by a motor 29. The water cooled chamber 24 has a wafer insertion port (not shown in the figure) which can be opened and closed by a gate valve, so that the wafer can be loaded into and unloaded from the furnace along the transverse direction. The base plate 25 is provided with a gas inlet and exhaust outlet, so that the gaseous atmosphere in the furnace can be controlled.

By using such a heat treatment apparatus 20 as mentioned above, the heat treatment of an SOI wafer for rapid heating and rapid cooling in an atmosphere containing hydrogen or argon is performed as follows.

First, the inside of the bell jar 21 is heated to a desired temperature, for example, 1000° C. to the melting point of silicon, by the heaters 22 and 22', and maintained at that temperature. By independently controlling the electric power supplied to each of the separate heaters, temperature profile can be obtained in the bell jar 21 along its height direction. Therefore, the heat treatment temperature can be selected by changing the position of the stage 27, i.e., the length of the supporting shaft 26 inserted into the furnace. The atmosphere for the heat treatment is controlled by introducing an atmospheric gas containing hydrogen or argon through a gas inlet of a base plate 25.

After the inside of the bell jar 21 is maintained at the desired temperature, an SOI wafer is inserted from the insertion port of the water cooled chamber 24 by a wafer handling apparatus not shown in the figure, which is disposed at an adjacent position of the heat treatment apparatus 20, and placed on the stage 27 waiting at its lowest position via, for example, a SiC boat etc. At this point, because the water cooled chamber 24 and the base plate 25 are cooled with water, the wafer is not heated to a high temperature at that position.

After the SOI wafer is placed on the stage 27, the stage 27 is immediately elevated to a position of desired temperature of from 1000° C. to the melting point of silicon by inserting the supporting shaft 26 into the inside of the furnace by the motor 29 so that the SOI wafer on the stage should be subjected to the high temperature heat treatment. In this operation, because the stage moves from its lowest position in the water cooled chamber 24 to the desired temperature position within, for example, only 20 seconds, the SOI wafer will be rapidly heated.

Then, by maintaining the stage 27 at the desired temperature position for a predetermined period of time (for example, 1–300 seconds), the wafer having an SOI layer can be subjected to the high temperature heat treatment in an atmosphere containing hydrogen or argon for the time that the wafer is maintained at the heating position. When the predetermined time has passed and the high temperature heat treatment was finished, the stage 27 is immediately descended by pulling the supporting shaft 26 out from the furnace by the motor 29, and positioned at the bottom of the water cooled chamber 24. This descending operation can also be performed within, for example, about 20 seconds. Because the water cooled chamber 24 and the base plate 25 are cooled with water, the wafer having an SOI layer on the stage 27 is cooled rapidly. Finally, the SOI wafer is unloaded by the wafer handling apparatus to finish the heat treatment.

When additional SOI wafers are to be heat-treated, those wafers can be introduced successively into the apparatus and subjected to the heat treatment, since the temperature in the heat treatment apparatus 20 is not lowered.

Another example of the rapid heating/rapid cooling apparatus (RTA apparatus) for SOI wafers used in the present invention will be explained hereafter.

Figure 7:
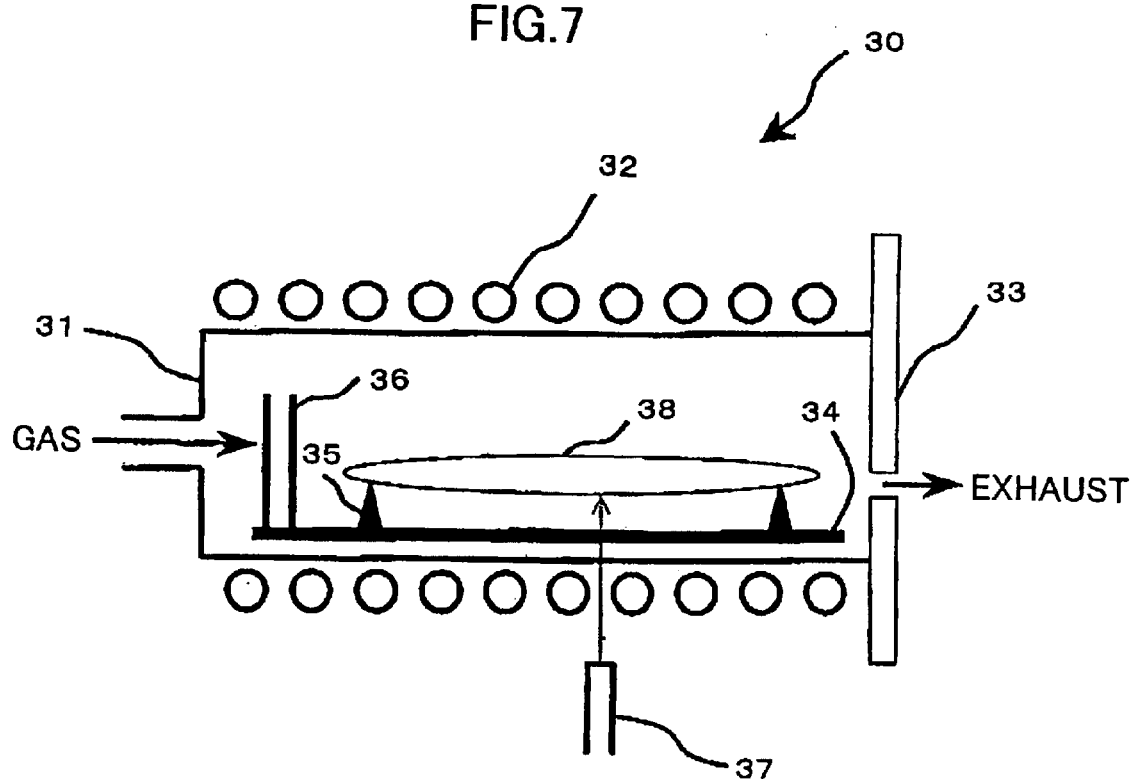
FIG. 7 is a schematic view showing another exemplary rapid heating/rapid cooling apparatus.

The heat treatment apparatus 30 shown in FIG. 7 has a chamber 31 consisting of quartz, and a wafer 38 is heat-treated within this chamber 31. Heating is achieved by heating lamps 32, which are disposed under and over the chamber and at left and right of the chamber so that they should surround the chamber 31. Electric power supplied to these lamps 32 can be independently controlled.

An auto shutter 33 is provided at the gas exhausting side, and it shuts the inside of the chamber 31 off from the outer air. The auto shutter 33 has a wafer loading port not shown in the figure, which can be opened and closed by a gate valve. The auto shutter 33 is also provided with a gas exhausting outlet, so that the atmosphere in the furnace can be controlled.

The wafer 38 is placed on a three-point supporting part 35 formed on a quartz tray 34. A buffer 36 made of quartz is provided at the gas inlet side of the tray 34, so that it can prevent the wafer 38 from being directly blown by the introduced gas flow.

Further, the chamber 31 is provided with a special window for temperature measurement, which is not shown in the figure, and the temperature of the wafer 38 can be measured by a pyrometer 37 installed in the outside of the chamber 31 through the special window.

By using the heat treatment apparatus 30 mentioned above, the heat treatment for rapid heating and rapid cooling of a wafer is performed as follows.

First, the wafer 38 is loaded into the chamber 31 from the loading port and placed on the tray 34 by a wafer handling apparatus disposed at an adjacent position of the heat treatment apparatus 30 but not shown in the figure. Then, the auto shutter 33 is closed.

Subsequently, electric power is supplied to the heating lamps 32 to heat the wafer 38 to a predetermined temperature, for example, 1100° C. to 1300° C. In this operation, it takes, for example, about 20 seconds to attain the desired temperature. Then, the wafer 38 is maintained at the temperature for a predetermined period of time, and thus the wafer 38 can be subjected to a high temperature heat treatment. When the predetermined time has passed and the high temperature heat treatment is finished, output of the lamps is reduced to lower the temperature of the wafer. This temperature decrease can be also performed within, for example, about 20 seconds. Finally, the wafer 38 is unloaded by the wafer handling apparatus to finish the heat treatment.

As explained above, the heat treatment by using a rapid heating/rapid cooling apparatus (RTA apparatus) according to the present invention include a method utilizing such an apparatus as shown in FIG. 6, wherein a wafer is immediately loaded into a heat treatment furnace set at a temperature within the aforementioned temperature range, and the wafer is immediately unloaded after the aforementioned heat treatment time has passed, a method utilizing such an apparatus as shown in FIG. 7, wherein a wafer is placed at a predetermined position in a heat treatment furnace and immediately heated by lamp heaters or the like, and so forth. The expressions of "to immediately load" and "to immediately unload" mean that there are not employed the conventional temperature increasing and decreasing operations performed over a certain period of time and the so-called loading and unloading operations in which wafers are slowly loaded into and unloaded from a heat treatment furnace. Of course, however, it takes a certain short period of time to transport the wafer to the predetermined position in the furnace, and it takes several seconds to several minutes depending on the performance of a transportation apparatus for loading a wafer.

When the heat treatment is performed by using such a heat treatment apparatus as shown in FIG. 6 or 7, the atmosphere for the heat treatment in an atmosphere containing hydrogen or argon according to the present invention may be, for example, 100% hydrogen atmosphere, 100% argon atmosphere or a mixed gas atmosphere of hydrogen and argon.

If such a heat treatment atmosphere is used, crystallinity of a damaged layer of SOI wafer surface is surely restored and surface roughness, in particular, short period components thereof, can be improved without forming a harmful coated film on the SOI wafer surface.

Among the heat treatments constituting the two-stage heat treatment performed in the present invention, the heat treatment performed in an atmosphere containing hydrogen or argon by using a batch processing type furnace will be explained hereafter.

The term "batch processing type furnace" used herein means a so-called batch type heat treatment furnace of, usually, vertical type or horizontal type, in which a plurality of wafers are placed, hydrogen gas is introduced, temperature is relatively slowly elevated to subject the wafers to a heat treatment at a predetermined temperature for predetermined time, and the temperature is relatively slowly lowered. Such an apparatus is capable of heat treatment of a large number of wafers at one time. Such an apparatus is also excellent in the controllability of temperature, and hence enables stable operation.

The heat treatment conditions for the batch processing type furnace are basically the same as those for the aforementioned RTA apparatus except that the heat treatment time becomes longer. It can be performed in 100% hydrogen atmosphere, 100% argon atmosphere or a mixed gas atmosphere of hydrogen and argon at a temperature of from 1000° C. to the melting point of silicon, and in particular, it can be performed more effectively at a temperature range of 1200–1350° C.

By performing a heat treatment in an atmosphere containing hydrogen or argon using a batch processing type furnace as described above, the long period components (for example, about 10 $\mu$m square) of surface roughness of SOI wafer can be improved. In particular, if the heat treatment using the aforementioned batch processing type furnaces is performed after the heat treatment using the aforementioned rapid heating/rapid cooling apparatus, surface roughness of SOI wafers can be improved over the range from short period to long period, and SOI wafers free from pits generated due to COPs can be obtained, even if CZ wafers are used as bond wafers.

Further, compared with the treatment method by using only the rapid heating/rapid cooling apparatus for a long period of time, the heat treatment can be performed more efficiently, and SOI wafers excellent in the surface characteristics can be produced with a high throughput at a low cost.

The SOI wafer of the present invention produced as described above can be an SOI wafer of which both of RMS values for 1 $\mu$m square and 10 $\mu$m square concerning surface roughness are 0.5 nm or less.

The SOI wafer of the present invention, of which both of RMS values for 1 $\mu$m square and 10 $\mu$m square concerning surface roughness are 0.5 nm or less as described above, has surface roughness substantially comparative to that of mirror-polished wafers over the range from short period to long period and is excellent in the film thickness uniformity. Therefore, it can be preferably used for the production of recent highly integrated devices.

The present invention will be specifically explained with reference to heat treatment tests according to the present invention as well as examples and comparative examples. However, the present invention is not limited to these.

<Heat treatment test using RTA apparatus>
Production of SOI wafers:

First, using a base wafer 1 and a bond wafer 2, both of which were mirror surface silicon wafers produced by the CZ method and having a diameter of 150 mm, a wafer 6 having an SOI layer was obtained through delamination of the bond wafer 2 according to the steps (a) to (e) shown in FIG. 1. In this production, thickness of the SOI layer 7 was made to be 0.4 $\mu$m, and the other major conditions including those for the ion implantation were as follows.

1) Thickness of buried oxide layer: 400 nm (0.4 $\mu$m)
2) Hydrogen implantation conditions: H$^+$ions, implantation energy: 100 keV, implantation dose: 8 $\times 10^{16}$/cm$^2$
3) Delamination heat treatment conditions: in N$_2$ gas atmosphere, 500 ° C., 30 minutes In this way, the wafer 6 having an SOI layer 7 with a thickness of about 0.4 $\mu$m was obtained.

Measurement of surface roughness:

First, as for surface roughness of a delaminated wafer as it is obtained in FIG. 1(*e*), i.e., a wafer having an SOI layer not subjected to the two-stage heat treatment according to the present invention at all, P-V (Peak to Valley) value and RMS value of its surface (delaminated plane) were measured by atomic force microscopy for 1 $\mu$m square and 10 $\mu$m square. The P-V values were 56.53 nm in average for 1 $\mu$m square, and 56.63 nm in average for 10 $\mu$m square. The RMS (root mean square roughness) values were 7.21 nm in average for 1 $\mu$m square, and 5.50 nm in average for 10 $\mu$m square.

Subsequently, the wafer having an SOI layer obtained through the aforementioned steps of (a) to (e) shown in FIG. 1 was subjected to an RTA treatment in a temperature range of 1000° C. to 1225° C. in an atmosphere containing hydrogen, and then its surface roughness in terms of P-V value and RMS value was measured for 1 μm square and 10 μm square by atomic force microscopy.

The results of the above measurement are shown in graphs of FIGS. 2–5.

Figure 2:
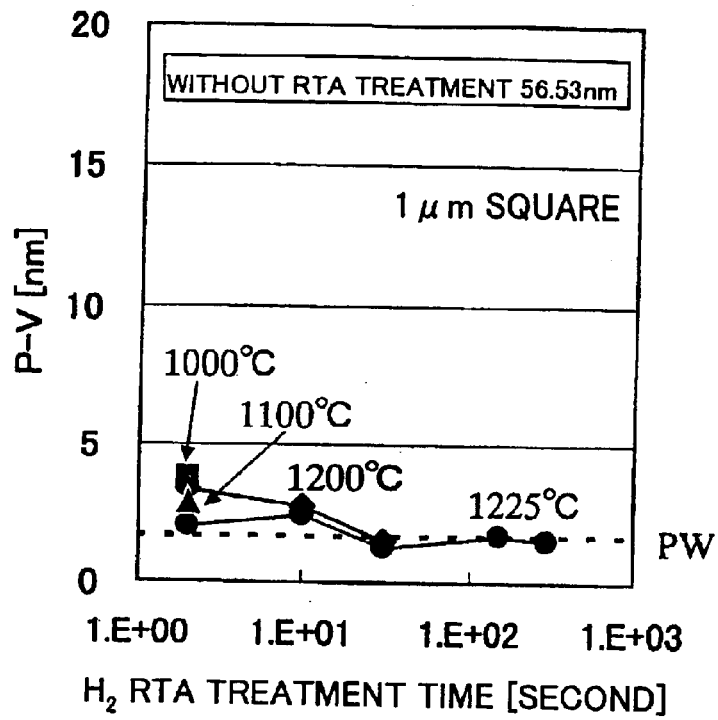
FIG. 2 shows a graph representing relationship among RTA treatment temperature, treatment time, and P-V value for 1 $\mu$m square.

FIG. 2 shows a graph representing relationship among the RTA treatment temperature, the treatment time and the P-V value for 1 μm square. This graph shows that the RTA treatment in a temperature range of 1000° C. to 1225° C. for several seconds to several tens of seconds greatly improved the short period components (1 μm) of surface roughness compared with the untreated one, and provided P-V values comparable to that of a mirror-polished wafer (PW). In FIG. 2, values corresponding to the temperatures of 1000, 1100, 1200 and 1225° C. are plotted with squares, triangles, rhomboids and circles, respectively.

Figure 3:
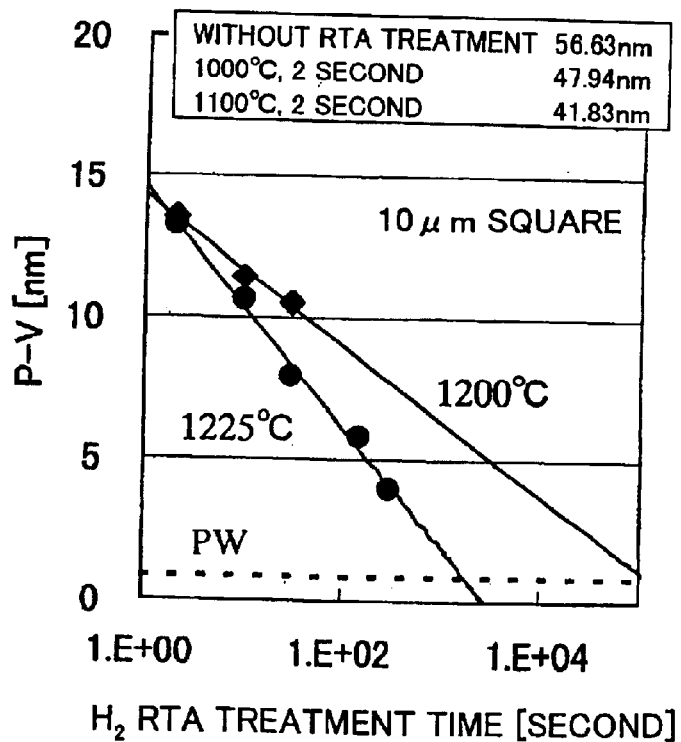
FIG. 3 shows a graph representing relationship among RTA treatment temperature, treatment time, and P-V value for 10 $\mu$m square.

FIG. 3 shows a graph representing relationship among the RTA treatment temperature, the treatment time and the P-V value for 10 μm square. It can be seen that the long period components (10 μm) of surface roughness were gradually improved as the treatment time became longer, unlike the case of the aforementioned short period components, and, to obtain a P-V value comparable to that of a mirror-polished wafer (PW), although it depended on the treatment temperature, a period of around several thousands of seconds was required even when the treatment was performed at, for example, 1225° C.

Figure 4:
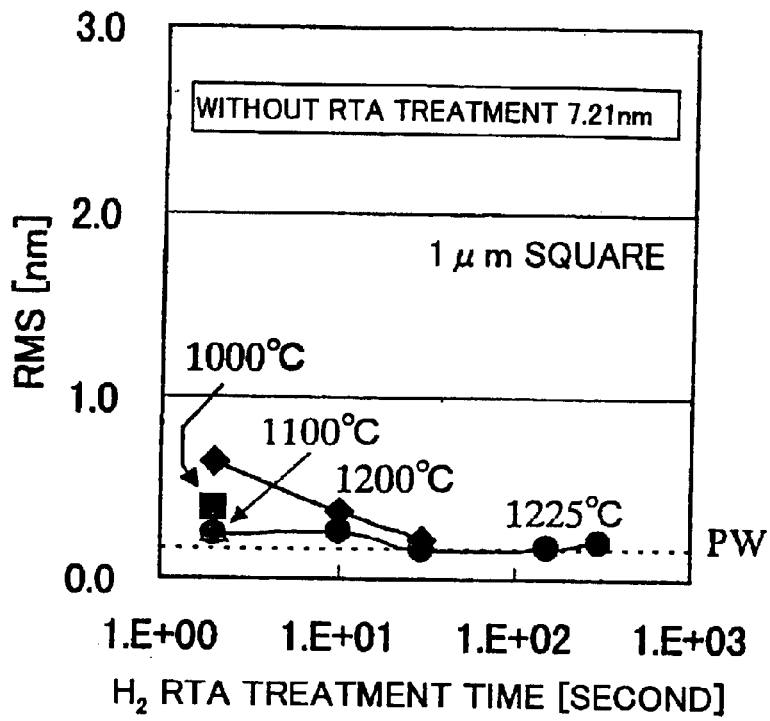
FIG. 4 shows a graph representing relationship among RTA treatment temperature, treatment time, and RMS value for 1 $\mu$m square.
Figure 5:
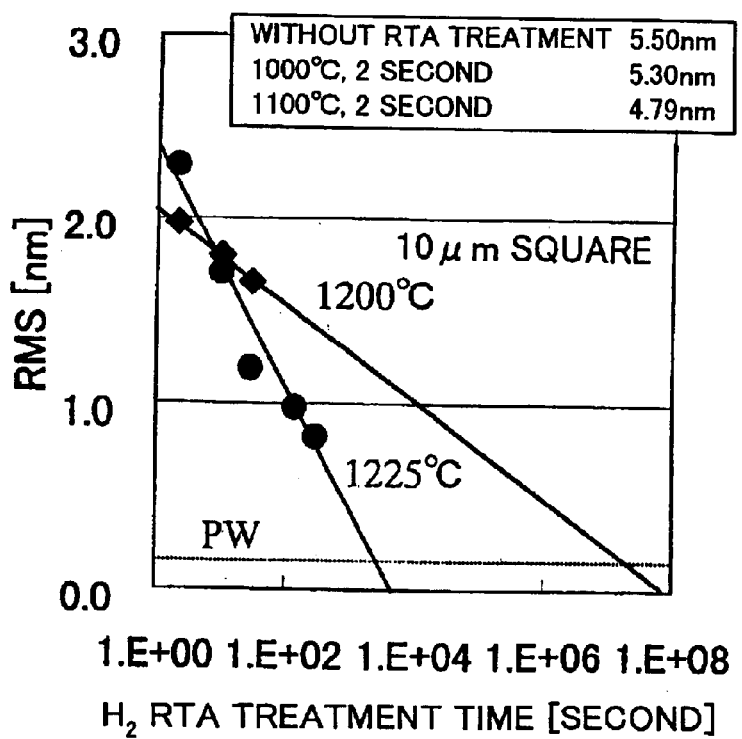
FIG. 5 shows a graph representing relationship among RTA treatment temperature, treatment time, and RMS value for 10 $\mu$m square.

FIGS. 4 and 5 show the measurement results for the short period components (1 μm) and the long period components (10 μm) of surface roughness in terms of RMS values, respectively, and they show relationship among the RTA treatment temperature, the treatment time and the RMS value.

From the results shown in the graph of FIG. 4, it can be seen that, although the RMS value decreased by the RTA treatment at 1200° C. as the treatment time became longer and the surface roughness tended to be improved with time, the RMS value was markedly improved to a level of a mirror-polished wafer (PW) by the RTA treatment for several seconds or several tens of seconds at any temperature. The relationship of the symbols used for the plotting and the temperatures in FIG. 4 is similar to that in FIG. 2.

On the other hand, as for the long period components of surface roughness, unlike the case of the aforementioned short period components, they were gradually improved as the treatment time became longer as evident from the graph of FIG. 5, and, to obtain an RMS value comparable to that of a mirror-polished wafer (PW), although it depended on the treatment temperature, it can be seen that a period of around several thousands of seconds was required even when the treatment was performed at, for example, 1225° C.

From the above results, it can be seen that the short period components (about 1 μm) of surface roughness are greatly improved to a level comparable to that of a mirror-polished wafer by the RTA treatment for an extremely short period of time (several seconds or several tens of seconds), whereas the long period components (about 10 μm) cannot be made to be at a level comparable to that of a mirror-polished wafer, although it depends on the treatment temperature, unless the heat treatment is performed for a long period of time (several thousands of seconds or more).

EXAMPLES 1 AND 2 AND COMPARATIVE EXAMPLE 1

Heat treatment of SOI wafers:

An SOI wafer produced under the same condition as the SOI wafer used for the aforementioned heat treatment test using the RTA apparatus according to the steps (a) to (e) shown in FIG. 1 was subjected to a heat treatment by an RTA apparatus under each of the conditions shown in Table 1 (100% hydrogen atmosphere), and then subjected to a heat treatment by a batch processing type furnace (100% argon atmosphere) to obtain an SOI wafer, which was subjected to the two-stage heat treatment according to the present invention (Examples 1 and 2). Separately, there was also prepared a wafer subjected to the heat treatment by the RTA apparatus but not subjected to the heat treatment by the batch processing type furnace thereafter

COMPARATIVE EXAMPLE 1

TABLE 1

| Heat treatment condition | Heat treatment by RTA apparatus | Heat treatment by batch processing type furnace |
|---|---|---|
| Example 1 | 1225° C., 10 seconds | 1200° C., 1 hour |
| Example 2 | 1200° C., 30 seconds | 1200° C., 1 hour |
| Comparative Example 1 | 1225° C., 10 seconds | None |

Surface roughness measurement:

Surface roughness (RMS value) of the SOI wafers obtained in the aforementioned Examples 1 and 2 and Comparative Example 1 was measured before and after the heat treatment by atomic force microscopy for 1 μm square and 10 μm square, and the results are shown in Table 2.

TABLE 2

| Results of surface roughness measurement | Before heat treatment (RMS: nm) | | After heat treatment (RMS: nm) | |
|---|---|---|---|---|
| | 1 μm square | 10 μm square | 1 μm square | 10 μm square |
| Example 1 | 7.21 | 5.50 | 0.18 | 0.28 |
| Example 2 | 7.50 | 5.80 | 0.20 | 0.30 |
| Comparative Example 1 | 7.45 | 5.75 | 0.21 | 1.60 |

As clearly seen from the results shown in Table 2, substantially no difference of the RMS values before the heat treatment was seen among the wafers for both of 1 μm square and 10 μm square.

On the other hand, after the heat treatment, although there was almost no difference of the values among the wafers for 1 μm square, the values for 10 μm square of the wafers of Examples 1 and 2 were greatly improved to a level near their RMS values for 1 μm square. However, as for the wafer of Comparative Example 1, which was not subjected to the heat treatment by the batch processing type furnace, the RMS value for 1 μm square was greatly improved, whereas the RMS value for 10 μm square was significantly larger than those of the wafers of Examples 1 and 2, and thus it can be seen that the long period components of surface roughness were not improved sufficiently.

EXAMPLES 3 AND 4

Production of bond wafers:

A silicon single crystal ingot was produced by the CZ method with applying a magnetic field, in which the pulling condition (V/G) was controlled to reduce grown-in defects in the crystal. This ingot was processed in a conventional manner to produce a mirror-surface CZ wafer (diameter: 200 mm, crystal orientation <100>) of which COPs were reduced for the whole crystal (Example 3). COPs and haze level on the surface of this wafer were measured by using a surface inspection apparatus (SP-1, produced by KLA/Tencor Co., Ltd.), and it was found that no COP having a diameter of 0.12 µm or more existed on the surface and the haze level of the mirror surface was about 0.03 ppm in average.

Separately, a CZ mirror-surface wafer (diameter: 200 mm, crystal orientation <100>), which was produced from a silicon single crystal ingot pulled with usual pulling condition (pulling rate: 1.2 mm/min), was loaded into an epitaxial growth apparatus to produce an epitaxial wafer having an epitaxial layer with a thickness of 10 µm at 1125° C. (Example 4).

The number of COPs having a diameter of 0.12 µm or more existing on the CZ wafer surface before the deposition of the epitaxial layer was about 1000 per wafer in average. Haze level of the epitaxial layer surface was about 0.2 ppm in average. There also was a wafer having projections called mounds.

Production of SOI wafers:

Ten wafers for each of the wafers produced as bond wafers by the methods of the aforementioned Example 3 and Example 4 were prepared, and SOI wafers were produced under the same conditions as the aforementioned heat treatment test by the RTA apparatus according to the steps (a) to (e) shown in FIG. 1. By inspecting the SOI surfaces and bonding surfaces after the delamination, existence of voids or blisters was investigated and cause of their generation was examined. As a result, it was confirmed that no void considered to be generated due to the haze or protrusions of the bond wafer surfaces (bonding surfaces) was observed at all for the SOI wafers produced by using the wafers of Example 3, whereas voids or blisters considered to be generated due to haze or mounds on the epitaxial layer surfaces were present on three SOI wafers of ten SOI wafers produced by using the wafers of Example 4.

Heat treatment of SOI wafers:

The aforementioned SOI wafers of Example 3 and Example 4 after the delamination were subjected to a heat treatment at 1225° C. for 3 hours by using a batch processing type furnace in an atmosphere of 97% argon/3% hydrogen, without polishing the SOI layer surfaces.

Surface roughness measurement:

The surface roughness of the aforementioned SOI wafers obtained in Examples 3 and 4 was measured for 1 µm square and 10 µm square before and after the heat treatment. The results are shown in Table 3.

TABLE 3

| | Before heat treatment (RMS: nm) | | After heat treatment (RMS: nm) | |
| --- | --- | --- | --- | --- |
| | 1 µm square | 10 µm square | 1 µm square | 10 µm square |
| Example 3 | 7.33 | 5.60 | 0.18 | 0.33 |
| Example 4 | 7.42 | 5.73 | 0.19 | 0.35 |

While the present invention was explained above with reference to the examples, the present invention is not limited to the embodiments described above. The above-described embodiments are mere examples, and those having the substantially same structure as that described in the appended claims and providing the similar functions and advantages are included in the scope of the present invention.

For example, while CZ wafers and epitaxial wafers were used in the aforementioned examples, wafers that can be used in the present invention are not limited to those, and FZ wafers and hydrogen (argon) annealed wafers can also be used.

Further, while the present invention was explained above mainly for the cases of bonding two of semiconductor wafers (silicon wafers), the present invention is not limited to those, and can similarly be applied to cases where a semiconductor wafer and an insulating substrate (for example, substrates of quartz, sapphire, alumina etc.) are directly bonded to produce SOI wafers.

What is claimed is:

1. A method for producing an SOI wafer by the hydrogen ion delamination method comprising at least a step of bonding a base wafer and a bond wafer having a micro bubble layer formed by gas ion implantation and a step of delaminating a wafer having an SOI layer at the micro bubble layer as a border, wherein, after the delamination step, the wafer having an SOI layer is subjected, in an atmosphere containing hydrogen or argon, to both a heat treatment utilizing a rapid heating/rapid cooling apparatus to improve the surface roughness of short periods of the SOI layer and a heat treatment utilizing a batch processing type furnace to improve the surface roughness of long periods of the SOI layer.

2. The method for producing an SOI wafer according to claim 1, wherein the two-stage heat treatment is performed by subjecting the wafers to a heat treatment in the rapid heating/rapid cooling apparatus and then a heat treatment in the batch processing type furnace.

3. A method for producing an SOI wafer by the hydrogen ion delamination method comprising at least a step of bonding a base wafer and a bond wafer having a micro bubble layer formed by gas ion implantation and a step of delaminating a wafer having an SOI layer at the micro bubble layer as a border, wherein an FZ wafer, an epitaxial wafer or a CZ wafer of which COPs at least on surface are reduced is used as the bond wafer, and the wafer having an SOI layer is subjected to a heat treatment under an atmosphere containing hydrogen or argon in a batch processing type furnace after the delamination step.

* * * * *